United States Patent
Yen-Kuang (12)

(10) Patent No.: US 6,515,855 B1
(45) Date of Patent: Feb. 4, 2003

(54) DETACHABLE DATA STORAGE DEVICE FOR COMPUTER

(75) Inventor: Yen-Kuang, Taipei (TW)

(73) Assignee: Inventec Corporation (TW)

( * ) Notice: Subject to any disclaimer, the term of this patent is extended or adjusted under 35 U.S.C. 154(b) by 157 days.

(21) Appl. No.: 09/631,674

(22) Filed: Aug. 3, 2000

(51) Int. Cl.[7] .............................................. G06F 1/16
(52) U.S. Cl. .................... 361/685; 361/609; 364/708.1; 369/162
(58) Field of Search ................................ 361/685, 680, 361/699, 681, 700, 609; 364/708.1; 360/32, 128–133; 369/289, 162; 439/160; 211/95, 96

(56) References Cited

U.S. PATENT DOCUMENTS 5,737,185 A * 4/1998 Morrison et al. ........... 361/685
5,921,792 A * 7/1999 Chen ........................ 439/152

* cited by examiner

Primary Examiner—Leo P. Picard
Assistant Examiner—Hung Van Duong

(57) ABSTRACT

A mechanism for mounting and removing a data storage device, such as detachable hard disk or optical disc driver, into and from a computer according to the present invention includes a lever pivotally mounted in the middle front of the data storage device; an engaging portion formed on one end of the lever; and a guiding rail formed on a carrier to be engaged with the engaging portion of the lever. The guiding rail is so designed to transform the movements of the lever into assistant forces of pushing and pulling the data storage device into and from the carrier. Moreover, the engagement of the lever to the guiding rail restricts the moving speed of the data storage device and prevents it from being bumped or damaged.

14 Claims, 7 Drawing Sheets

DETACHABLE DATA STORAGE DEVICE FOR COMPUTER

BACKGROUND OF THE INVENTION

1. Field of Invention

The present invention relates to a detachable data storage device (such as a magnetic or an optical disc driver) of a computer, and more particularly relates to a mechanism for mounting and removing a data storage device in and from a carrier prepared on the computer.

2. Related Art

In order to carry, interchange or protect the data of computers, the data storage devices, such as hard discs or optical disc devices, can be made as detachable units which can be easily removed from and mounted to carriers prepared on the computers. Since there are power cords and signal wires to be connected between the detachable unit and the carrier on the computer, connectors on both sides are generally used for the purpose. In order to make firm connections, the connectors usually have to bear suitable contact forces which will also cause the requirement of applying certain forces for mounting and removing the detachable units.

A simple structure for a detachable data storage device is to form a handle on the data storage device; provide sliders for the storage device to move into and out of the main body of computer; and provide connectors on the back of the data storage device and on the bottom of the cabinet for the data storage device inside the computer. The handle makes an easier pulling-out of the data storage device. But, when pushing the data storage device into the cabinet, the user may push too fast or to hard to bump the connectors and cause damage to the pickup head of the data storage device, the sliders or the connectors due to the great impact and vibration.

Therefore, a prior art, as shown in FIG. 1, provides a handle mechanism to solve a part of the problems. A handle bar 12 is pivotally mounted through a pivot 11 in a front comer of a data storage device 1. The main body 19 of computer is formed with a cavity 190 for receiving the data storage device 1. A hole 191 is further formed aside the cavity 190 for receiving a latch portion 121, located near the pivot 11, of the handle bar 12. When the handle bar 12 with the data storage device 1 is pushed into the cavity 190, the handle bar 12 is further rotated in the arrow direction as shown to a locking position where the latch portion 121 clamping on the hole 191, and the other end 122 of the handle bar 12 is locked by a latch 13 located at another front comer of the data storage device 1. When the data storage device 1 is to be moved out, the latch 13 is first moved to release the end 122 of the handle bar 12, then, the bar 12 with the data storage device I can be pulled out. Though the handle bar 12 is helpful in pulling and pushing the data storage unit 1, the force acting only at one side of the data storage device 1 is easy to cause unbalanced and uneven movements on two sides of the device 1 and even damage the components.

SUMMARY OF THE INVENTION

It is therefore an object of the present invention to provide a mechanism for mounting and removing a data storage device into and from a computer.

A further object of the present invention is to provide a mechanism for mounting and removing a data storage device which can be prevented from being bumped and damaged during being operated.

Another object of the present invention is to provide a mechanism for mounting and removing a data storage device which has no problem of uneven movement as the prior art does.

To achieve the aforesaid objects, a mechanism for mounting and removing a data storage device into and from a computer according to the present invention mainly includes a lever pivotally mounted in the middle front of the data storage device; and a guiding rail engaged with an engaging portion of the lever and formed on a carrier which is to receive the data storage device. The guiding rail is so designed to transform the movements of the lever into assistant forces of pushing and pulling the data storage device into and from the carrier. Moreover, the engagement of the lever to the guiding rail restricts the moving speed of the data storage device and prevents it from being bumped or damaged.

A mechanism for mounting and removing a data storage device into and from a computer according to the present invention includes a lever pivotally mounted in the middle front of the data storage device; an engaging portion formed on one end of the lever; and a guiding rail formed on a carrier to be engaged with the engaging portion of the lever. The pivot of the lever, the engaging portion and the guiding rail are preferably formed on or symmetrically to a central line in the moving direction of the data storage device, so that the force acting on the data storage device remains balanced to keep the movement smooth. The engaging portion acting on the guiding rail also increases the force and decreases the speed of movement, therefore prevents the device from being bumped or damaged.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

Figure 1:
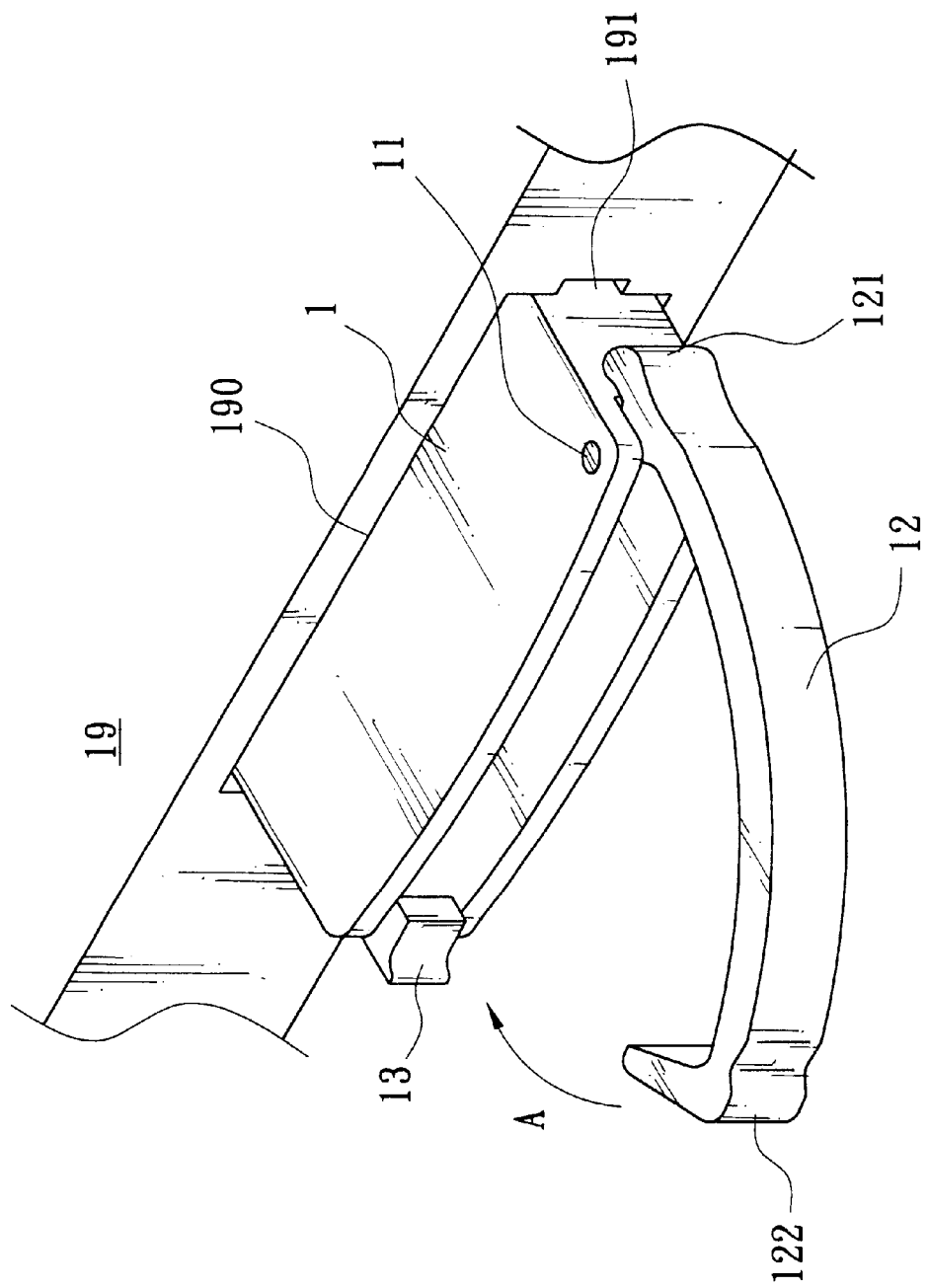
FIG. 1 is a perspective view of a prior art handle mechanism for a detachable data storage device.

A prior art handle mechanism for a detachable data storage device has been described above with reference to FIG. 1.

Figure 2:
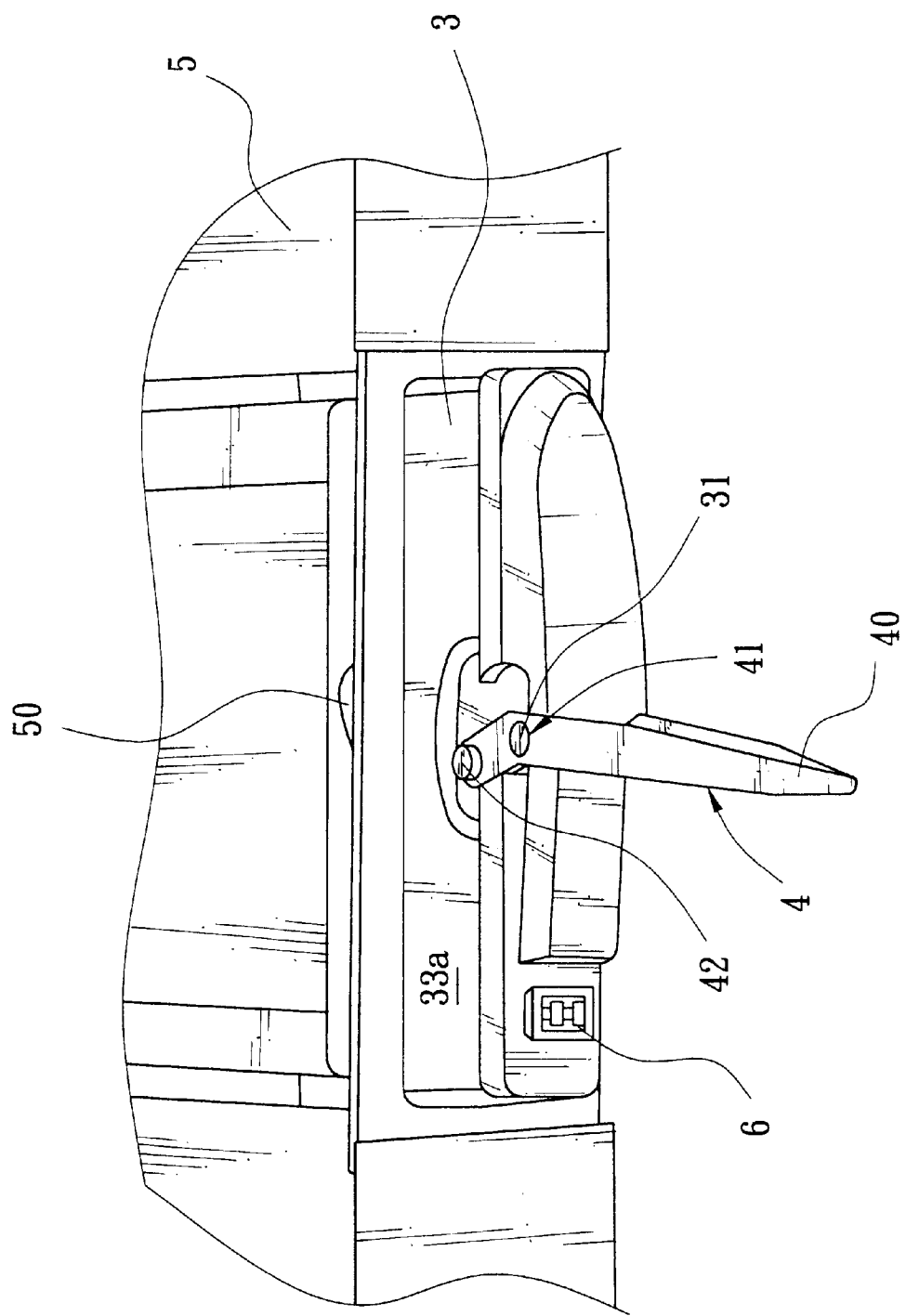
FIG. 2 is a perspective partial view of a mechanism of the present invention showing a data storage device being removed from a carrier.

Now referring to FIG. 2, a perspective partial view of a mechanism for mounting and removing a data storage device to and from a carrier is shown. The data storage device 3 is a detachable hard disk or detachable optical disc driver for a computer. The carrier 5 is a cabinet or frame of the computer for receiving the data storage device 3.

Figure 7A:
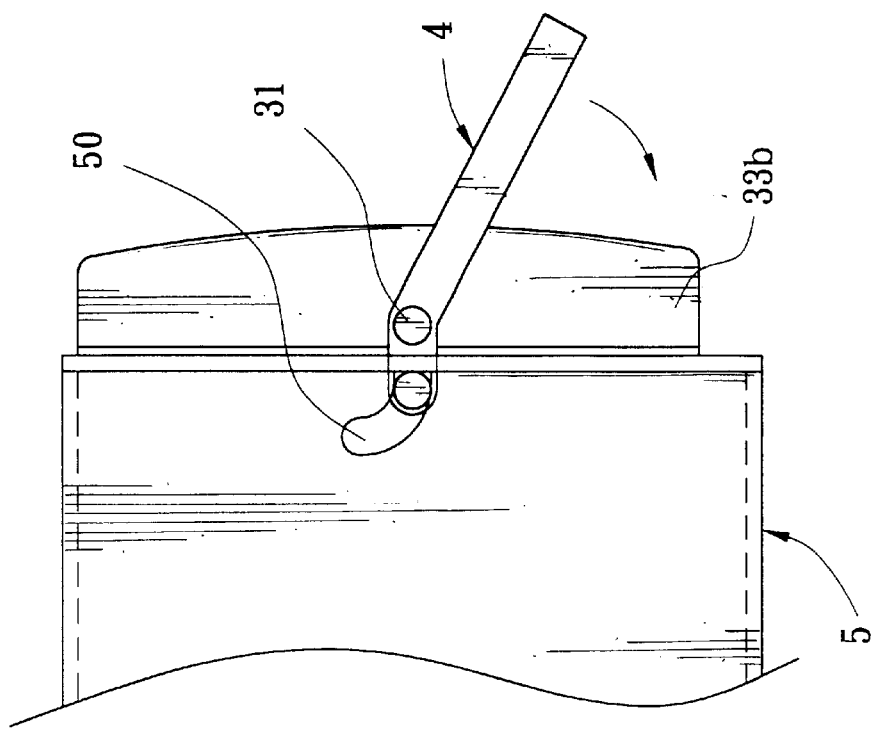
FIGS. 7A and 7B are side views of a further embodiment of the present invention showing the lever, mounted in left and right sides of a data storage device, in a locking and an open positions respectively.
Figure 7B:
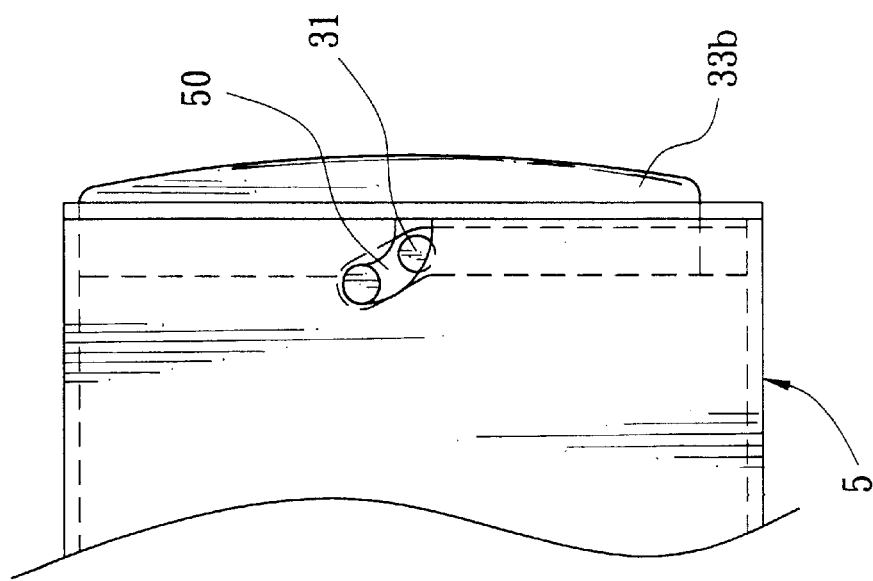

The mechanism of the present invention mainly includes: a lever 4 pivotally mounted in the middle front of the data storage device 3; and a guiding rail 50 engaged with the lever 4. to move the data storage device 3. The lever 4 can be defined by functions as three portions: a force portion 40 at a free end of the lever 4 for users to operate; a pivotal portion 41 mounted on the data storage device 3 via a pivot 31; and an engaging portions 42 located on another end of the lever 4. The pivot 31 is preferably located on a central line along the moving direction of the data storage device 3 so as to prevent the device 3 from being chocked by unbalanced movements from a one-side force as the prior art. In the preferred embodiments of the present invention, two pivots 31 are formed symmetrically to the central line along the moving direction of the data storage device 3, near the middle front of the device 3, and on a upper edge 33*a* and a lower edge (unshown) of the device 3 as shown in FIG. 2; or on a left edge 33*b* and a right edge (unshown) of the data storage device 3 as shown in FIGS. 7A and 7B. As the function of a lever, the portion between the pivot 41 and the force portion 40 is the "acting arm", and the portion between the pivot 41 and the engaging portion 42 is the "reacting arm". In this application, the acting arm is preferably larger than the reacting arm so as to make the lever 4 force-saving.

Figure 3:
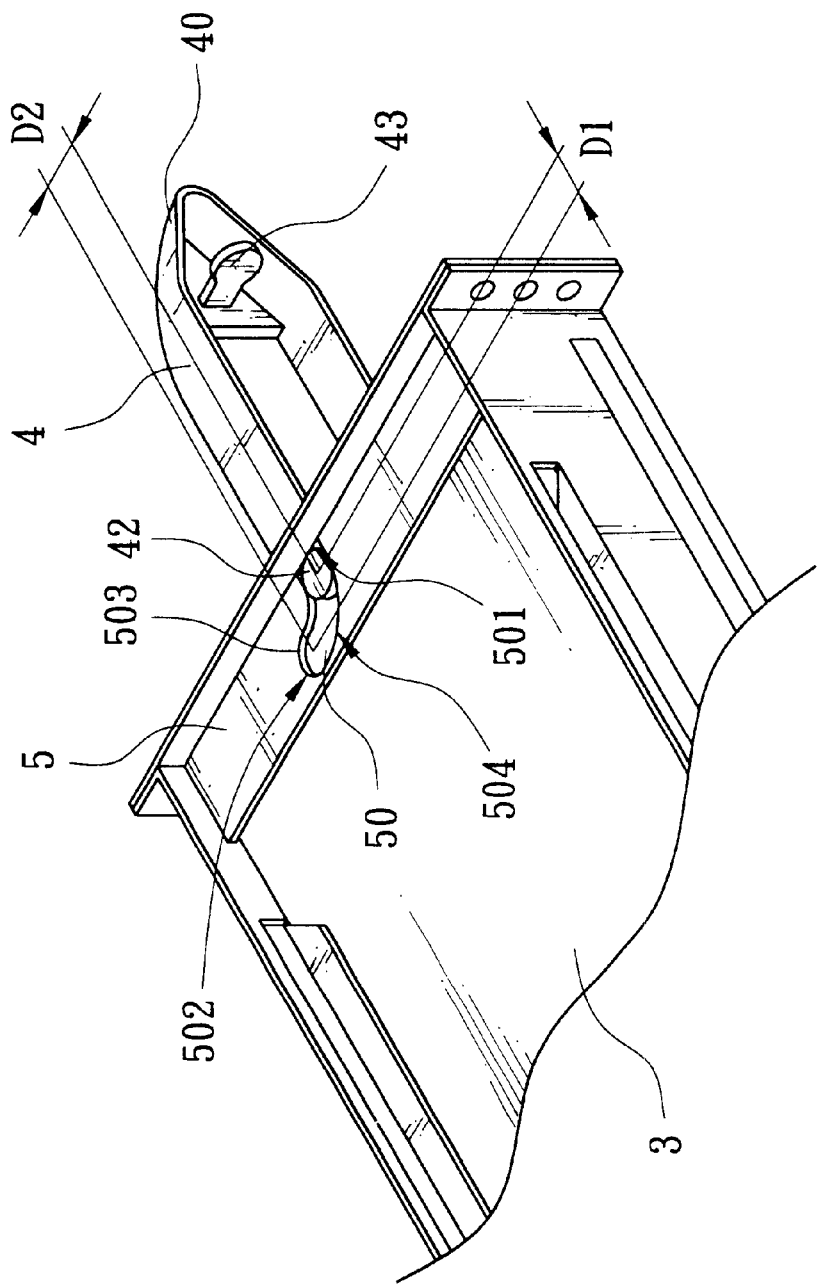
FIG. 3 is a working condition of a mechanism of the present invention showing an engaging portion of a lever just being moved into a guiding rail.
Figure 5:
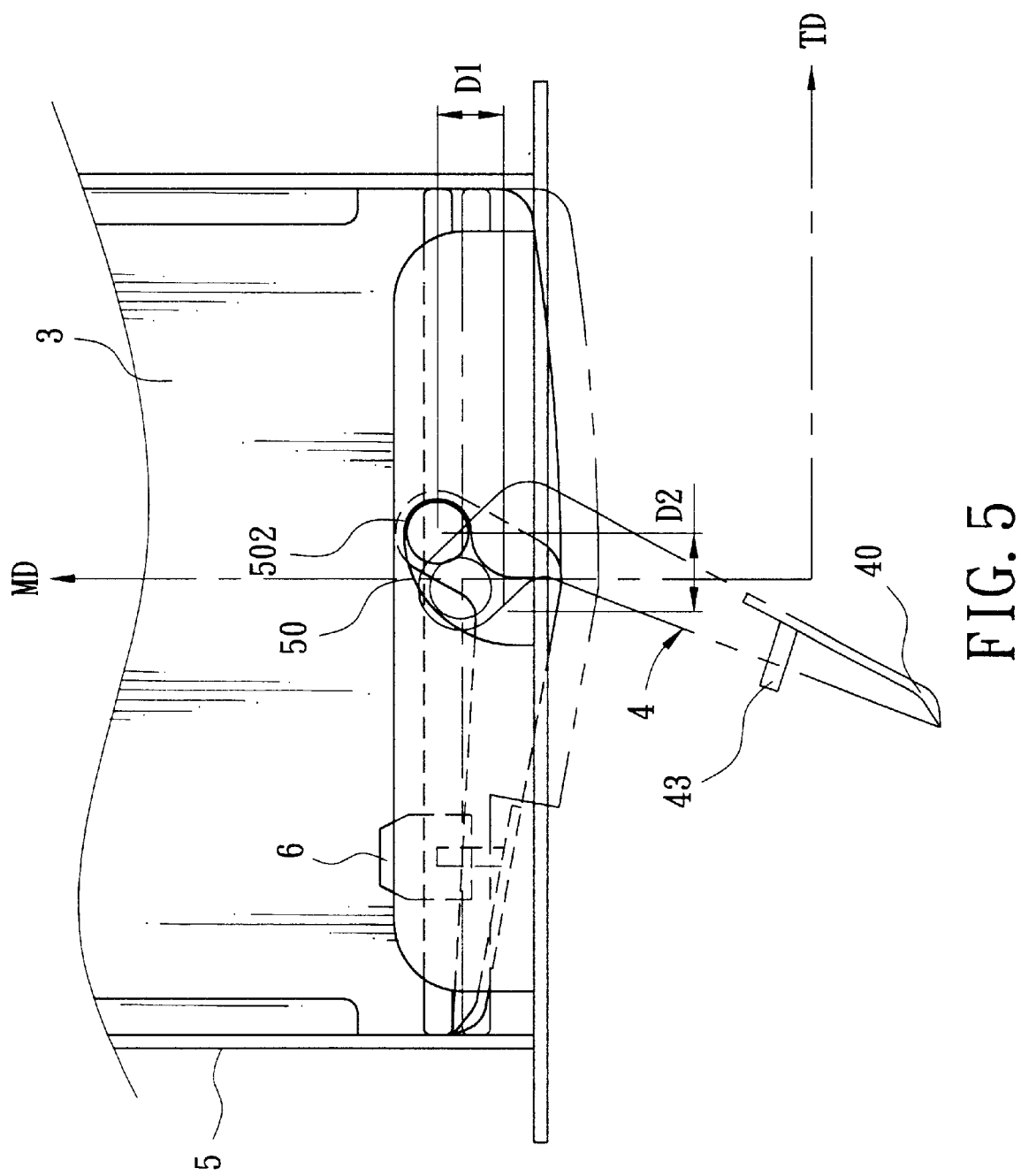
FIG. 5 is a top view of a mechanism of the present invention showing function of the engaging portion and the guiding rail.

The shape of the guiding rail 50, as shown in FIG. 3 and FIG. 5, can be defined by its function as four portions: an opening 501, as a starting point of the guiding rail 50 where the engaging portion 42 of the lever 4 moves into; an ending point 502 of the guiding rail 50 where the engaging portion 42 of the lever 4 reaches ultimately; and a first and a second reacting surfaces 503 and 504 extending from the opening 501 to the ending point 502. The first reacting surface 503 is to transform the operating force of the lever 4 into an assistant force to push the device 3 into the carrier 5. And, the second reacting surface 504 is to transform the operating force of the lever 4 into an assistant force to pull the device 3 out of the carrier 5.

The paths of the first reacting surface 503 and the second reacting surface 504 are determined by two factors. The first factor is the depth of connectors linking the data storage device 3 to the carrier 5. The depth D1 determines the distance in the moving direction of the data storage device 3 from the opening 501 to the ending point 502 of the guiding rail 50 that makes the engaging portion 42 of the lever 4 fully push the connector of device 3 into the connector of carrier 5.

The second factor is the moving distance D2 of the engaging portion 42 in the transversal direction perpendicular to the moving direction of the data storage device 3 when the device 3 is actuated by the engaging portion 42 of the lever 4 moving from the opening 501 to the ending point 502 of the guiding rail 50. Practically, the distance D2 is almost the central distance between the engaging portion 42 and the pivot 31.

The guiding rail 50 is so designed to transform the movements of the lever 4 into assistant forces of pushing and pulling the data storage device 3 into and from the carrier 5. Moreover, the engagement of the engaging portion 42 of the lever 4 to the guiding rail 50 restricts the moving speed of the data storage device 3 and prevents it from being bumped or damaged. The engaging portion 42 moving from the opening 501 of the guiding rail 50 till the ending point 502 will cause the pivot 31, i.e., the data storage device 3 move with the depth D1, while the engaging portion 42 moves in the transversal direction with the distance D2. As a result, the central path of the guiding rail 50 is a curve. And, the paths of the first reacting surface 503 and the second reacting surface 504 can be determined by the contour of the engaging portion 42 moving along the central path of the guiding rail 50.

Figure 4:
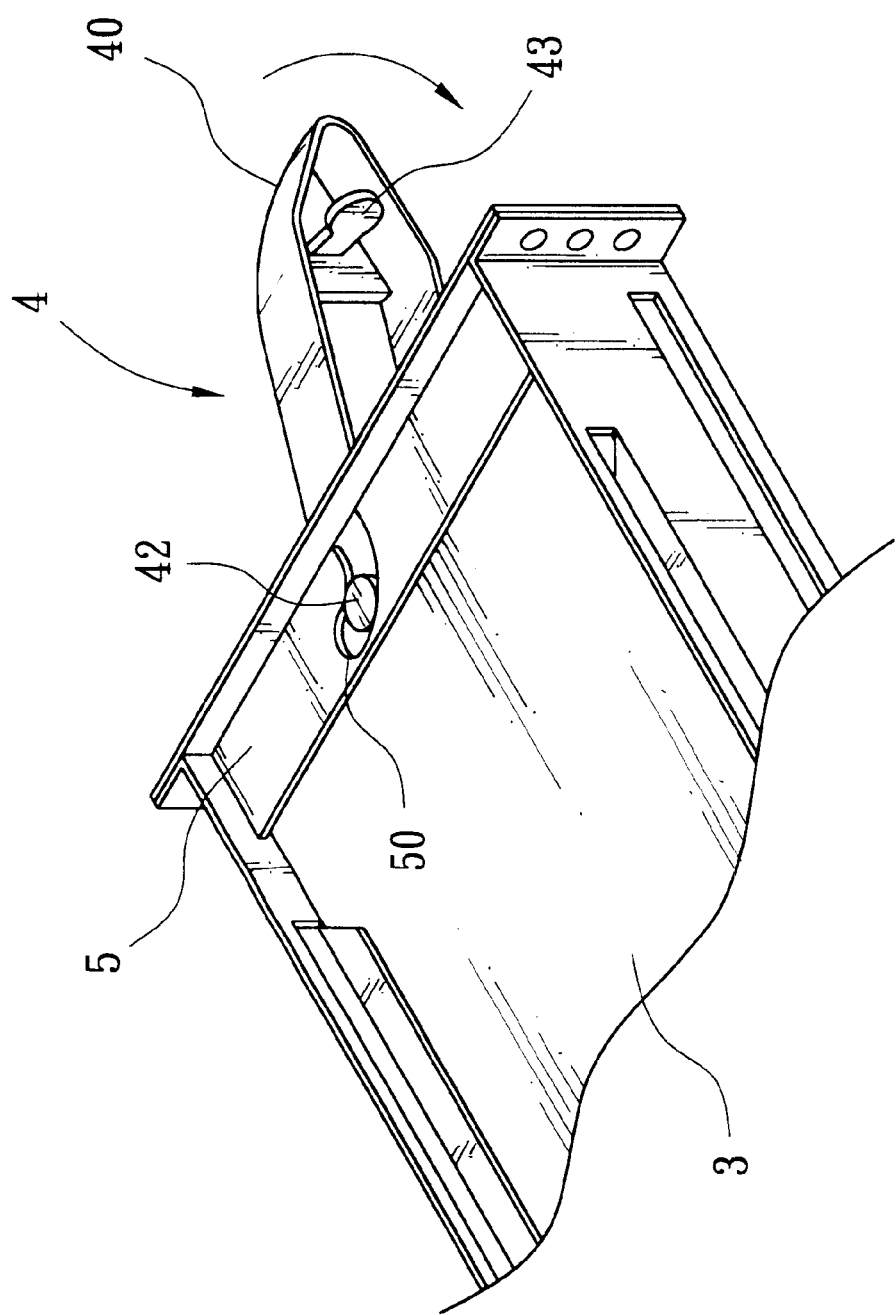
FIG. 4 is further a working condition of a mechanism of the present invention showing an engaging portion of a lever being moved in a guiding rail to force the data storage device into the carrier.

Referring again to FIGS. 2 to 5, when a data storage device 3 is to be installed (FIG. 2), the user handles the lever 4 on the force portion 40 to put the device 3 into the carrier 5 where the engaging portion 42 is aiming at the opening 501 of the guiding rail 50. Then, when the connector in data storage device 3 just touches the connector in the carrier, the engaging portion 42 of the lever 4 also reaches the opening 501 of the guiding rail 50 (see FIG. 3). In this position, the engaging portion 42 is limited by the second reacting surface 504 to prevent the data storage device 3 from bumping into the carrier 5. Further, the user moves the lever 4 in the arrow direction as shown in FIG. 4 to cause the engaging portion 42 moving in the guiding rail 50 from the opening 501 to the ending point 502 via the first reacting surface 503 so as to force the data storage device 3 wholly into the carrier 5. In this process, the connector formed the data storage device 3 will smoothly engage with the connector formed on the carrier 5 to attain the wire connection.. And, finally, the lever 4, formed in a suitable shape, will fully match with the front panel 32 of the data storage device 3 when the device 3 has been connected with the carrier 5.

As shown in FIG. 2, a latch 6 can be installed on the front panel 32 of the data storage device 3 for locking a fastening portion 43 formed on the lever 4 when the lever 4 reaches the final match position to the front panel 32. The latch 6 will hold the lever 4 in place to prevent the lever 4 from being unintentionally moved and the data storage device 3 from being unintentionally removed from the carrier 5. The latch 6 can be of any kind of conventional devices, such as a two-stage latch as once press to lock and further press to release, which are generally used in common furniture, and will not be detailedly described herein.

Figure 6:
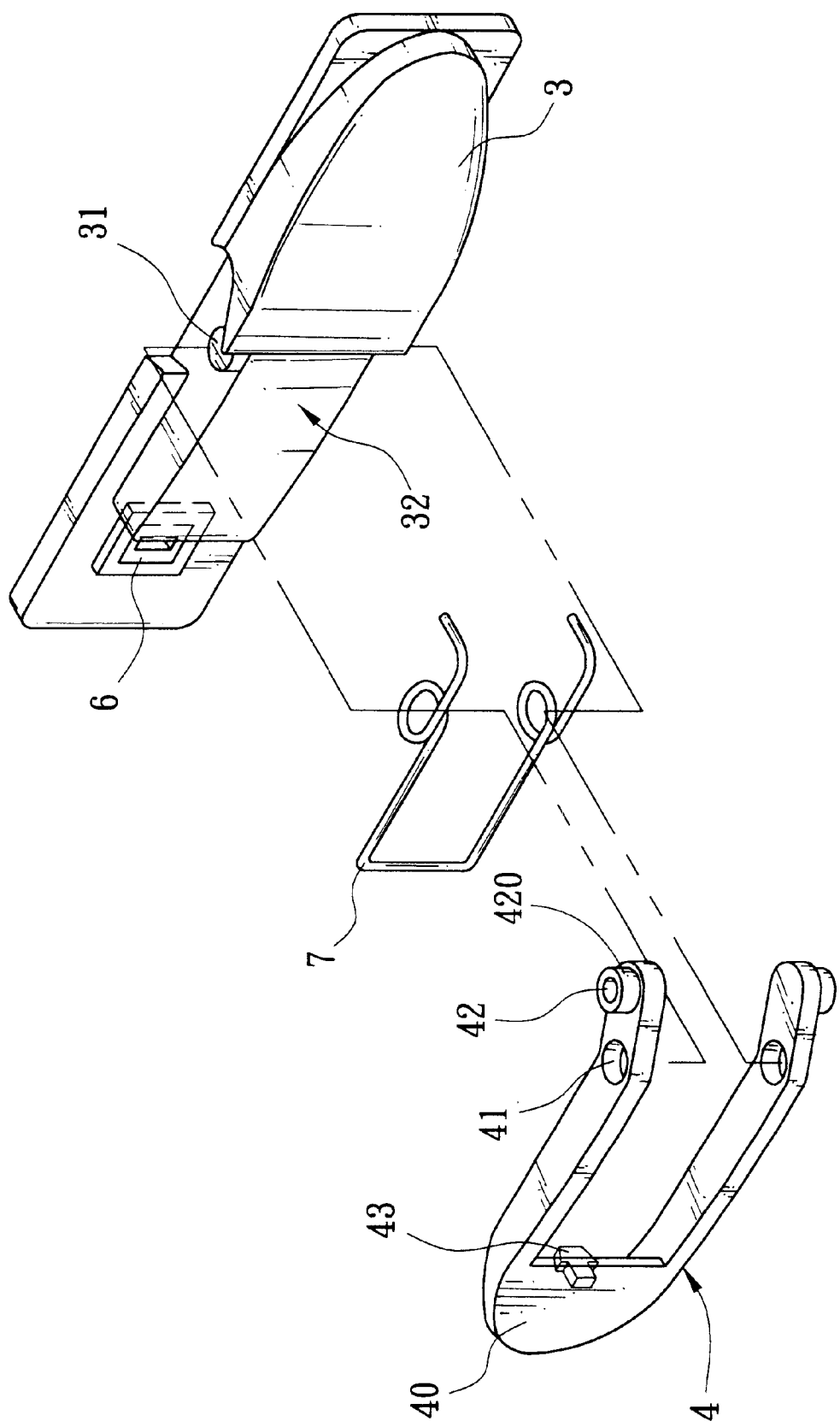
FIG. 6 is an exploded view of another embodiment of the present invention in which a twisted spring is incorporated.

Further referring to FIG. 6, which is another embodiment of the present invention, where a twisted spring 7 is incorporated with the pivot 31 (or at another suitable position) to provide a preload to the lever 4. The preload makes the lever 4 rotate to a suitable open position for the user to handle as the latch 6 has released the lever 4. Besides using a fixed short stem as the engaging portion 42, a roller, a bearing or other similar components 420 can be applied to the engaging portion 42 so as to decrease the friction between the engaging portion 42 and the guiding rail 50 and attain a rolling contact.

In the aforesaid embodiments, the engaging portions 42 and the guiding rails 50 are formed as stems in opposite sides of the data storage device 3 for the best balance movements. But, actually, as far as the engaging portion 42 and the guiding rail 50 are located in the central line of the moving direction of the data storage device 3, even a single engaging portion 42 and the guiding rail 50 can do the job well.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A mechanism for mounting and removing a data storage device into and from a computer, comprising:

a lever, pivotal mounted in the middle front of the data storage device, having a force portion, a pivot and an engaging portion formed on a reacting portion of the lever; and a guiding rail, formed on a carrier and engaged with the engaging portion of the lever, comprises: an opening, as a starting point of the guiding rail where the engaging portion of the lever moves into; an ending point of the guiding rail where the engaging portion of the lever reaches ultimately; a first reacting surface, extending from the opening to the ending point for transforming the operating force of the lever into an assistant force to push the data storage device into the carrier; and a second reacting surface, extending from the opening to the ending point for transforming the operating force of the lever into an assistant force to pull the data storage device out of the carrier.

2. A mechanism for mounting and removing a data storage device into and from a computer as recited in claim 1 wherein the pivot of the lever is mounted on the data storage device.

3. A mechanism for mounting and removing a data storage device into and from a computer as recited in claim 1 wherein the engaging portion comprises a stem.

4. A mechanism for mounting and removing a data storage device into and from a computer as recited in claim 1 wherein the engaging portion further comprises a roller.

5. A mechanism for mounting and removing a data storage device into and from a computer as recited in claim 1 further comprises a latch formed on the front panel of the data storage device; and a fastening portion, formed on the lever, to be selectively locked and released by the latch.

6. A mechanism for mounting and removing a data storage device into and from a computer as recited in claim 1 wherein a distance of a path of the guiding rail from the opening to the ending point thereof in the moving direction of the data storage device is to fully push the data storage device into the carrier.

7. A mechanism for mounting and removing a data storage device into and from a computer as recited in claim 1 wherein a distance of a path of the guiding rail from the opening to the ending point thereof in a transversal direction perpendicular to the moving direction of the data storage device is about the central distance between the engaging portion and the pivot.

8. A mechanism for mounting and removing a data storage device into and from a computer as recited in claim 2 wherein the pivot of the lever is mounted across two portions on the data storage device symmetrically to a central line in the moving direction of the data storage device.

9. A mechanism for mounting and removing a data storage device into and from a computer as recited in claim 2 wherein the pivot of the lever is mounted on one side of the data storage device.

10. A mechanism for mounting and removing a data storage device into and from a computer as recited in claim 4 wherein the engaging portion comprises a bearing.

11. A mechanism for mounting and removing a data storage device into and from a computer as recited in claim 5 further comprises a twisted spring incorporated with the pivot to provide a preload to the lever to rotate the lever to a suitable open position for the user to handle when the latch has released the lever.

12. A mechanism for mounting and removing a data storage device into and from a computer as recited in claim 8 wherein the pivot of the lever is mounted across two portions on the upper and the lower sides of the data storage device.

13. A mechanism for mounting and removing a data storage device into and from a computer as recited in claim 8 wherein the pivot of the lever is mounted across two portions on the left and the right sides of the data storage device.

14. A mechanism for mounting and removing a data storage device into and from a computer as recited in claim 8 wherein the pivot of the lever is mounted near the front panel of the data storage device.

* * * * *